United States Patent
Hase (10) Patent No.: US 8,786,165 B2
(45) Date of Patent: Jul. 22, 2014

(54) QFN/SON COMPATIBLE PACKAGE WITH SMT LAND PADS

(75) Inventor: Andreas Alfred Hase, Berlin (DE)

(73) Assignee: TSMC Solid State Lighting Ltd., Hsin-Chu (TW)

( * ) Notice: Subject to any disclaimer, the term of this patent is extended or adjusted under 35 U.S.C. 154(b) by 1021 days.

(21) Appl. No.: 11/521,828

(22) Filed: Sep. 15, 2006

(65) Prior Publication Data

US 2007/0063336 A1 Mar. 22, 2007

Related U.S. Application Data

(60) Provisional application No. 60/717,818, filed on Sep. 16, 2005.

(51) Int. Cl.
*H01L 41/00* (2013.01)
*H02N 2/00* (2006.01)
*H01L 23/06* (2006.01)

(52) U.S. Cl.
USPC .... 310/348; 310/349; 310/313 A; 310/313 R; 257/684; 257/E23.011

(58) Field of Classification Search
CPC ..... H03H 9/10; H03H 9/1057; H03H 9/1071; H03H 9/0538; H03H 9/05; H03H 9/1078; H03H 9/08921; H03H 9/6483; H03H 9/724; H03H 3/08; H01L 2224/48227; H01L 2224/29805; H01L 2224/49811; H01L 2224/1532; H01L 2224/16152
USPC ........... 257/676, 698, 730, 678, 668, 704, 99, 257/690, 962, 693, 686, E23.01, E23.011, 257/E23.141, 723, 724, 684, E29.324, 257/E21.613, E23.003, E23.004, 648; 438/50, 52; 310/348, 349, 313 A, 313 R
See application file for complete search history.

(56) References Cited

U.S. PATENT DOCUMENTS

| | | | |
|---|---|---|---|
| 4,922,324 A * | 5/1990 | Sudo | 257/700 |
| 5,866,939 A | 2/1999 | Shin et al. | |
| 6,130,473 A | 10/2000 | Mostafazadeh et al. | |
| 6,143,981 A | 11/2000 | Glenn | |
| 6,229,200 B1 | 5/2001 | Mclellan et al. | |
| 6,242,281 B1 | 6/2001 | Mclellan et al. | |
| 6,281,568 B1 | 8/2001 | Glenn et al. | |

(Continued)

OTHER PUBLICATIONS

Hsu, Tai-Ran, ed. MEMS Packaging. London: INSPEC, 2004.*

(Continued)

*Primary Examiner* — Phat X Cao
*Assistant Examiner* — Diana C Vieira
(74) *Attorney, Agent, or Firm* — Haynes and Boone, LLP (57) ABSTRACT

A leadless package and method for manufacturing silicon based leadless QFN/SON compatible packages are described. In addition the package allows for hermetic sealing of devices while maintaining electrical and optical access. Micro-vias with feed-through metallization through a silicon structure facilitates a surface mount technology-compatible silicon package with bottom SMT pads and top surface device integration. Sloped edges on the SMT side enable solder filleting for post solder inspection. Hermetic seal can be attained for example using anodic bonding of a glass lid or using metal soldering. Metal soldering enables the use of solder bumps to provide electrical connections for the package to the lid with integrated device functionality used for sealing. Hermetically sealed silicon packages eliminates the need for an extra packaging layer required in plastic packages and provides a standard interface for enclosing one or more discrete devices.

29 Claims, 4 Drawing Sheets

(56) References Cited

U.S. PATENT DOCUMENTS

| | | |
|---|---|---|
| 6,294,100 B1 | 9/2001 | Fan et al. |
| 6,331,451 B1 | 12/2001 | Fusaro et al. |
| 6,433,277 B1 | 8/2002 | Glenn |
| 6,448,633 B1 | 9/2002 | Yee et al. |
| 6,455,356 B1 | 9/2002 | Glenn et al. |
| 6,469,369 B1 | 10/2002 | Lee |
| 6,475,827 B1 | 11/2002 | Lee et al. |
| 6,476,478 B1 | 11/2002 | Swiss et al. |
| 6,501,161 B1 | 12/2002 | Lee |
| 6,521,987 B1 | 2/2003 | Glenn et al. |
| 6,525,406 B1 | 2/2003 | Chung et al. |
| 6,545,347 B2 | 4/2003 | Mclellan |
| 6,585,905 B1 | 7/2003 | Fan et al. |
| 6,818,464 B2 | 11/2004 | Heschel |
| 7,425,881 B2* | 9/2008 | Shibata ............... 333/193 |
| 2004/0046248 A1* | 3/2004 | Waelti et al. ............... 257/712 |
| 2004/0061207 A1* | 4/2004 | Ding ............... 257/678 |
| 2004/0104460 A1* | 6/2004 | Stark ............... 257/678 |
| 2004/0157367 A1* | 8/2004 | Wong et al. ............... 438/106 |
| 2004/0189146 A1* | 9/2004 | Ueda et al. ............... 310/313 A |
| 2004/0251790 A1* | 12/2004 | Masuko et al. ............... 310/348 |
| 2004/0259325 A1* | 12/2004 | Gan ............... 438/456 |
| 2005/0145274 A1* | 7/2005 | Polce et al. ............... 136/244 |
| 2005/0184304 A1* | 8/2005 | Gupta et al. ............... 257/98 |
| 2005/0189635 A1* | 9/2005 | Humpston et al. ............... 257/678 |
| 2005/0248008 A1* | 11/2005 | Wilson ............... 257/678 |
| 2005/0263784 A1* | 12/2005 | Yaw et al. ............... 257/98 |
| 2005/0280016 A1* | 12/2005 | Mok et al. ............... 257/99 |
| 2006/0006405 A1* | 1/2006 | Mazzochette ............... 257/99 |
| 2006/0110905 A1* | 5/2006 | Adkisson et al. ............... 438/612 |
| 2006/0151203 A1* | 7/2006 | Krueger et al. ............... 174/260 |
| 2006/0197215 A1* | 9/2006 | Potter ............... 257/704 |
| 2006/0292747 A1* | 12/2006 | Loh ............... 438/116 |

OTHER PUBLICATIONS

Jedec Solid State Product Outline, Prepared by the Jedec JC-II Committee, Issue J, May 2005, MO-220, 19 pages.

Jedec Design Standard, Design Requirements for Outlines of Solid State and Related Products, Jedec Publication 95, Design Guide 4.20, Small Scale Plastic Quad and dual Inline, Square and Rectangular, no-lead Packages (With Optional Thermal Enhancements), Small Scale (QFN/SON), Jedec Solid State Technology Association, Issue B, Item 11.02-711S, Jun. 2005, 12 pages.

Design Summary for Quad Flat No-Lead Logic, Texas Instruments Inc., 2004, 12 pages.

JEDEC Solid State Product Outlines, "Dual compatible thermally enhanced plastic very thin and very very thin fine pitch quad flat no lead package families," HW-PQFP/HV-PQFP/PSO-N, Aug. 2003, 4 pages.

M. Harris et al., "New Quad Flat No-Lead package Optimizes Performance in Medium-Power Integrated Circuits," Intersil Technical White Paper, 7 pages (2002).

* cited by examiner

QFN/SON COMPATIBLE PACKAGE WITH SMT LAND PADS

CROSS-REFERENCE TO RELATED APPLICATION(S)

The present application claims the benefit of priority of U.S. Provisional Application No. 60/717,818, which was filed on Sep. 16, 2005. The contents of U.S. Application 60/717,818 are incorporated by reference as part of this application.

TECHNICAL FIELD

The present disclosure relates to leadless semiconductor packages.

BACKGROUND

Quad flatpack-no lead (QFN) and small outline-no lead (SON) are leadless packages for integrated circuits (ICs) and micro-components, such as semiconductor and micro-electromechanical system (MEMS) devices. The packages have peripheral terminal pads, and an exposed die pad for mechanical and thermal integrity. As the terminals are essentially flush with the bottom surface of the package body, the packages are considered to be "leadless" or "no-lead." A QFN/SON package may be used in a variety of applications, including applications requiring low standoff heights, improved thermal performance, reduced size or reduced weight. Cell phones, personal digital assistants (PDAs), portable music and video players can significantly benefit from QFN/SON packages.

Quad (QFN) versions of the package have terminals on all four sides of the bottom surface of the package. Dual Inline (SON) versions generally have terminals only on two opposite sides. The packages can be mounted, for example, on the bottom side of a printed circuit board (PCB). The small size of the packages better utilizes the available PCB area.

Additional details of small scale plastic QFN/SON packages may be found, for example, in the JEDEC Design standard, "Design Requirements for Outlines of Solid State and Related Products," JEDEC Publication 95, Design Guide 4.2 (June 2005). As the QFN/SON packages according to the foregoing JEDEC design standard are plastic, the integrated circuit or other micro-components are not sealed hermetically within the package.

SUMMARY

A leadless package for integrated circuits and micro-components and method for manufacturing the same are disclosed.

In one aspect, manufacturing a leadless package for integrated circuits and micro-components includes disposing multiple surface mounting technology (SMT) land pads on a bottom surface of a silicon structure with the SMT land pads arranged to provide electrical connections to a substrate. A concave surface is provided on a top surface of the silicon structure with the concave surface defining a cavity arranged to envelop one or more discrete devices. Multiple electrical contacts are disposed on the top surface with the electrical contacts arranged to provide electrical connections to the one or more devices enveloped in the cavity. A plurality of micro-vias are created and arranged to extend from the SMT land pads on the bottom surface to the electrical contacts in the cavity of the top surface of the silicon structure. Sloped edges are provided on the bottom surface with the sloped edges configured to facilitate solder filleting on the SMT land pads for a post soldering inspection. Feed-through metallization is disposed through the micro-vias with the feed-through metallization arranged to form electrical connections from the SMT land pads on the bottom surface through the silicon structure to the electrical contacts on the top surface. A silicon lid is disposed on the top surface of the structure with the silicon lid arranged to provide a hermetic seal.

In another aspect, manufacturing a leadless package for integrated circuits and micro-components includes disposing a metallization layout on a silicon structure. A lid is hermetically sealed onto the silicon structure using metal soldering or anodic bonding. The hermetic seal is achieved in a single leadless package. Multiple sloped edges are disposed on a SMT side of the silicon structure. Extending to the sloped edges are multiple electrical contacts with the sloped edges arranged to facilitate solder filleting on the electrical contacts.

In yet another aspect, manufacturing a leadless package for integrated circuits and active and passive micro-components includes providing a silicon structure enveloping one or more MEMS devices. A standard interface is disposed from the one or more MEMS devices to a substrate. A lid is hermetically sealed onto the silicon structure using metal soldering or anodic bonding with the hermetic seal achieved in a single leadless package.

In yet another aspect, manufacturing a leadless package for integrated circuits and active or passive micro-components includes disposing a concave surface on a silicon structure with the concave surface defining a housing arranged to envelop one or more integrated circuits and one or more active or passive micro-components. A lid is disposed onto the silicon structure with the lid arranged to provide both a hermetical seal and the leadless package for the integrated circuits or the micro-components. Sloped edges and SMT land pads are disposed on a SMT side of the silicon structure for solder filleting on the SMT land pads.

Implementations can include one or more of the following features. For example, disposing the silicon lid may further include disposing a metal soldering ring on the top surface with the metal soldering ring arranged to provide the hermetic seal. Alternatively, disposing the silicon lid can further include disposing multiple metal solder pads arranged to provide electrical contacts between the silicon structure and the lid. In yet another alternative, disposing the silicon lid may further comprises disposing metallization on the sloped cavity sidewalls for shielding or reflection. In yet another alternative, disposing the silicon lid may further include using anodic bonding to provide the hermetic seal. Further yet still, disposing the silicon lid may further include disposing a transparent lid arranged to allow light to pass through the transparent lid. Disposing the concave surface to define the cavity can further include providing sloped sidewalls. Also, disposing the electrical contacts can include disposing wire bond pads configured to provide electrical connections to the one or more devices using wire bonds. In addition, a layout of the SMT land pads that complies with quad flatpack-no lead/small outline-no lead (QFN/SON) layout rules may be provided. Futher, disposing the electrical contacts can further include disposing dedicated contact layouts arranged to provide electrical connection to the one or more devices using flip-chip bonds. Also, multiple solder bumps may be disposed on the top surface with the solder bumps arranged to electrically connect the lid and the silicon structure. A second device can be disposed on the lid with the second device arranged to electrically connect to the solder bumps. Feed-through metallization disposed through the micro-vias may be accomplished using a dry or wet etching technique. Multiple sloped side edges may be disposed on the bottom surface of the silicon structure with the sloped side edges arranged to extend electrical connections to the SMT land pads. Further, disposing the sloped side edges may further include using wet etching to obtain a slope angle of about 54.7 degrees.

In yet another aspect, a leadless package for integrated circuits and micro-components includes a concave surface defining a housing composed of silicon. The housing includes a silicon structure, a lid, and space for holding integrated circuits or micro-components. Multiple interconnected walls are disposed through the silicon structure, and the interconnected walls define a plurality of micro-vias arranged to provide electrical connections between the housing and a substrate when the micro-vias are filled with feed-through metallization. The leadless packages also includes a metal solder ring arranged to provide a hermetic seal for the housing. Further, a SMT contact pad layout with sloped edges are included for post soldering inspection.

These general and specific aspects may be implemented using a system, a method, or a computer program, or any combination of systems, methods, and computer programs.

Certain implementations may provide one or more of the following advantages. Introduction of sloped edges to silicon packages provides for solder filleting on the SMT side. In addition, hermetically sealed silicon packages eliminates the need for an extra packaging layer required in plastic packages and provides a standard interface for enclosing one or more discrete devices.

Other features and advantages will be readily apparent from the following detailed description, the accompanying drawings, and the claims.

BRIEF DESCRIPTION OF DRAWINGS

Like reference symbols in the various drawings indicate like elements.

DETAILED DESCRIPTION

Figure 1A:
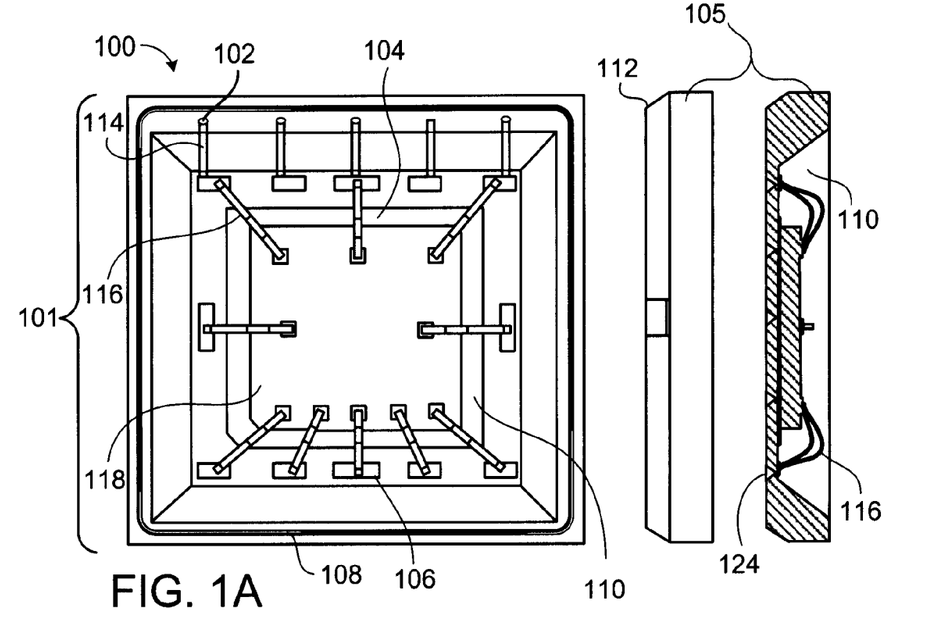
FIGS. 1A-B illustrate a silicon structure for a discrete device integration using wirebonds.
Figure 1B:
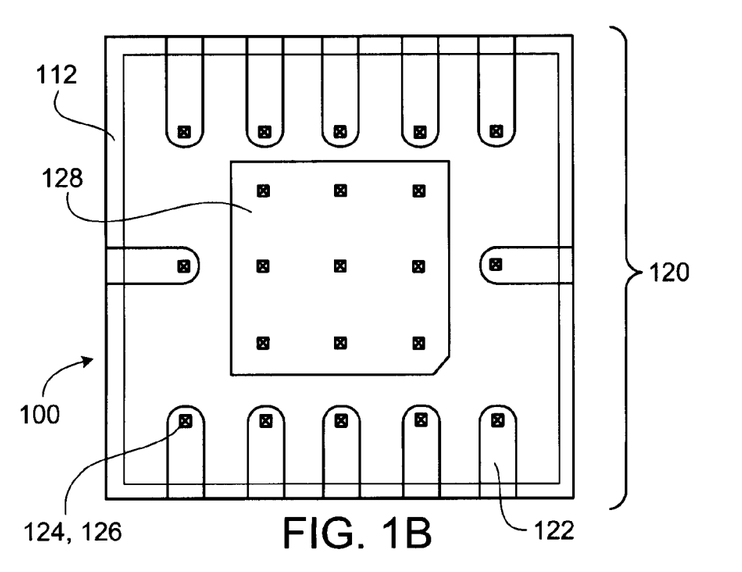

FIGS. 1A-B illustrate a small leadless silicon package for housing one or more discrete and/or passive devices. A discrete device in this or any other implementations can include an integrated circuit (IC), a micro-electromechanical system (MEMS), an electro-optical device or the like. A passive device in this or any other implementations can include devices such as capacitors, resistors or the like. The one or more discrete and/or passive devices can be mounted either by adhesives or by soldering, and an electrical connection to the mounted one or more discrete and/or passive devices can be achieved by using wirebonds, conductive adhesives or metal solder. FIG. 1A illustrates top 101 and side surfaces and cross sectioning 105 of a silicon structure 100. Referring to the top surface 101, the silicon structure 100 has a cavity 110 for housing one or more discrete and/or passive devices 118. A ground (GND) metallization plane and thermal pad 104, may be disposed in the center of the cavity 110 to enhance the thermal performance. The bottom of the cavity 110 may be populated with electrical contacts 106 to provide electrical connections to the one or more discrete and/or passive devices 118 housed in the cavity 110. Electrical connection can be obtained with wirebonds 116 to the electrical contacts 106 on the silicon structure 100. In addition, a metal sealing ring 108 can be disposed on the top surface 101 near the periphery to facilitate hermetically sealing the silicon structure 100 with a lid (not shown) using metal solder. Optional electrical connections to the lid can be achieved during a metal soldering process via electrical contacts 102 disposed on the top surface 101. These electrical contacts 102 provide an electrical connection to the electrical contacts 106 disposed on the bottom surface of the cavity 110 via electrical lines 114.

FIG. 1B illustrates a bottom surface 120 of the silicon structure 100. Multiple surface mount technology (SMT) land pads 122 are disposed on the bottom surface 120 of the silicon structure 100. Specifically, the land pads 122 are located near the periphery and extend to two or more edges of the bottom surface 120. The edges include sloped sides 112 which can be obtained by dry or wet etching during silicon processing. The sloped sides 112 have a slope angle that complies with the requirements of the metal deposition and may be defined by wet etching with a resulting angle of about 54.7°. Metallization of the land pads 122 extends along the sloped side edges 112. The sloped side edges 112 facilitate inspection of the solder wetting after the package has been soldered to a substrate (e.g., a mother board or a circuit board). In addition, the land pads 122 may comply with QFN/SON design rules.

To provide electrical connection(s) between the silicon structure 100, including the one or more discrete and/or passive devices housed within, and a substrate (e.g., a circuit board), micro-vias 124 extending from the land pads 122 on the bottom surface 120 to the top surface 101 of the silicon structure 100 can be implemented. The micro-vias 124 may be filled and sealed with feed-through metallization 126 extending through the micro-vias 124 from the bottom surface 120 to the top surface 101 of the silicon structure 100. Feed-through metallization connects the ground or thermal pad 104 to the large area ground or thermal pad metallization 128 on the SMT side on surface 120. The feed-through metallization may be created using an electroplating technique. An example of such a technique is disclosed in U.S. Pat. No. 6,818,464, which is incorporated herein by reference.

Figure 2:
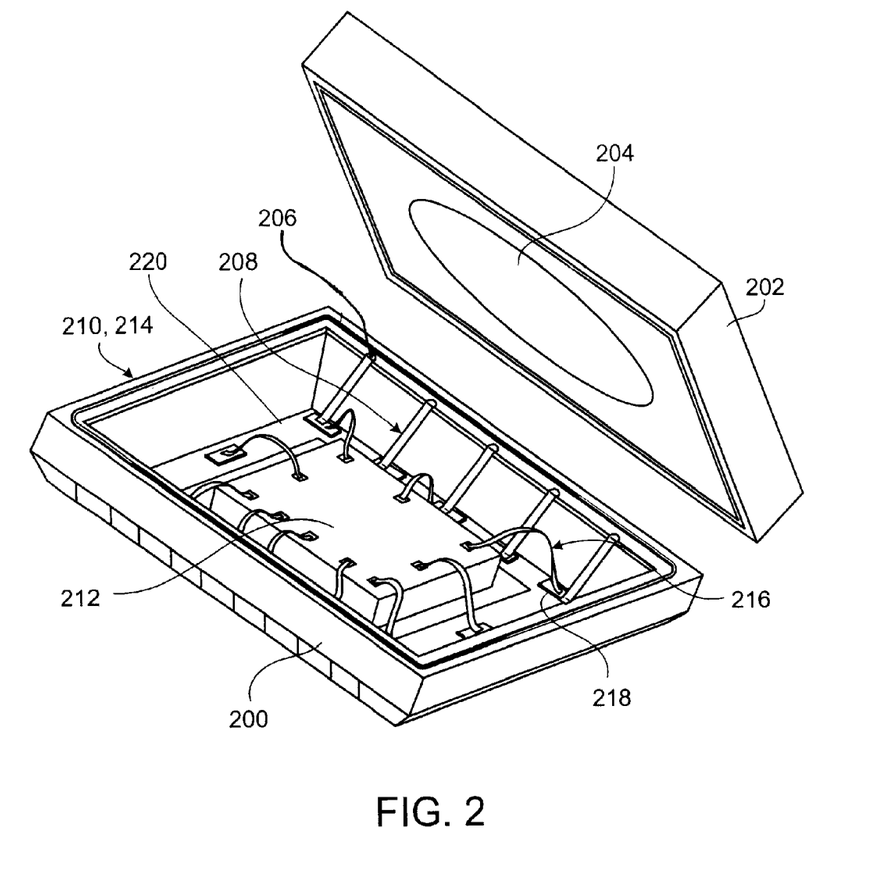
FIG. 2 represents a silicon structure with an integrated discrete component and a corresponding lid with integrated functionality

Referring to FIG. 2, a QFN-compatible silicon structure 200 for obtaining a hermetic package with integrated one or more discrete and/or passive devices is described. For example, a discrete chip 212 can be disposed in the cavity 220 and electrically connected to wirebond pads 218 using wire bonds 216. Solder bumps 206 also are connected electrically to the wirebond pads 218 through metallization 208. The solder bumps 206 provide electrical access to a device 204 integrated in a lid 202 (e.g., a MEMS). A metal solder ring 210 is disposed on the top surface 214 of the silicon structure 200 to obtain a hermetic seal using metal soldering to the lid 202 with the corresponding metallization. Such a package encloses both the discrete chip 212 and the MEMS device 204 in a single hermetically sealed package. The wirebond pads 218 are connected to the bottom side (not shown) with the SMT land pads (not shown).

Figure 3A:
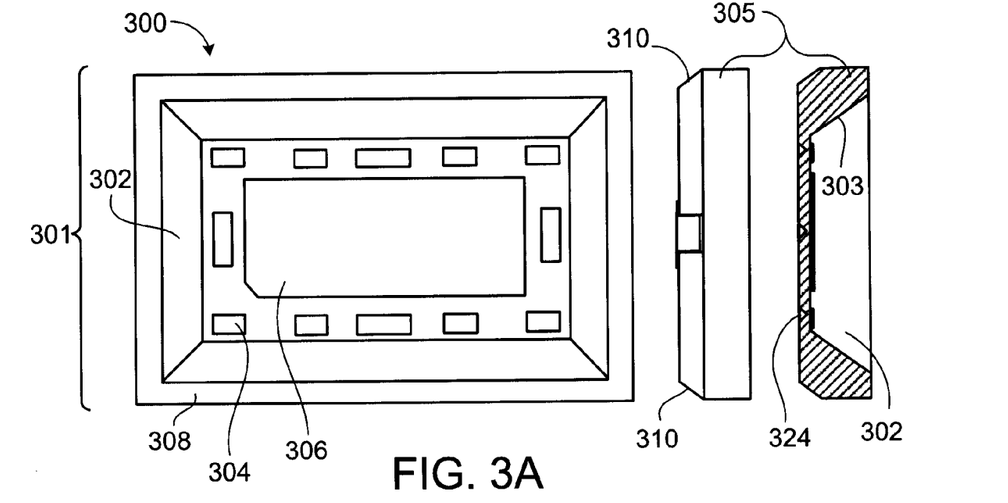
FIGS. 3A-B illustrate a silicon structure for non-hermetic applications or to achieve a hermetical seal using anodic bonding.
Figure 3B:
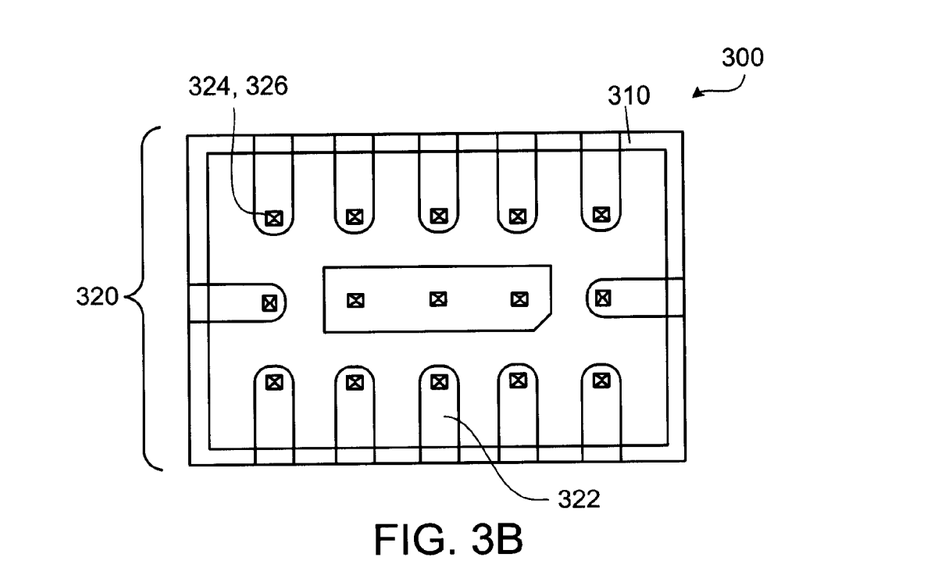

FIGS. 3A-B illustrate a small leadless package 300. The silicon structure 300 can include features similar to the silicon structure 100 for providing a hermetical seal using metal soldering (FIGS. 1A-B). However, the silicon structure 300 does not provide a metal solder ring and electrical contacts to a lid but instead provides an area 308 designated for hermetic sealing by anodic bonding on a top surface 301 of the silicon structure 300. FIG. 3A illustrates top 301 and side surfaces and cross section 305 of the silicon structure 300.

Referring to the top surface 301, the silicon structure 300 has a cavity 302 for housing a discrete and/or passive device (e.g. devices similar to those described with respect to FIGS. 1A-B above). A ground (GND) metallization plane and thermal pad 306 may be disposed in the center of the cavity 302 to enhance the thermal performance. The bottom of the cavity 302 may be populated with electrical contact pads 304 to provide electrical connections to the one or more discrete and/or passive devices housed in the cavity 302. The metallization layout can be arranged to fit the device requirements. In addition to contact pad 304 metallization for wirebonding and adhesive, die attach solder can be provided on the contact pads 304 and on the thermal pad 306 to facilitate flip chip mounting of the one or more discrete and/or passive devices. The sloped sidewalls 303 of the cavity 302 can be metallized for shielding or reflection purposes.

FIG. 3B illustrates a bottom surface 320 view of the silicon structure 300. Multiple land pads 322 are disposed on the bottom surface 320 of the silicon structure 300. Specifically, the land pads 322 are located near the periphery and extend to two or more edges of the bottom surface 320. The edges include sloped sides 310 and the metallization of the land pads 322 extends along the sloped side edges 310. The sloped side edges 310 facilitate inspection of the solder wetting after the package has been soldered to a substrate (e.g., a mother board or a circuit board). In addition, the land pads 322 may comply with QFN/SON design rules. The land pads 322 are electrically connected to the contact pads 304 in the cavity 302 through hermetically sealed micro-vias 324. Feedthrough metallization 326 forms the electrical contact between the pads 322 and 304.

In one implementation, a silicon structure (e.g., 200) and the corresponding lid 202 are provided to individual end users for hermetically sealing one or more desired active and passive devices in a single package. Depending on the application and the devices enclosed in the package, the end user can easily generate customized hermetically sealed packages. For example, the package described above comprising the silicon structure 200 and the lid 202 provides a standardized interface for hermetically sealing a desired MEMS device with a driver and optionally additional passive components in one simple package and a standardized QFN/SON type interface to a circuit board for the MEMS device. In contrast, previous plastic packages could not be hermetically sealed, and thus required an additional packaging layer to provide the hermetic seal. Therefore, this technique eliminates an entire packaging layer by taking advantage of an encapsulation technology to provide the standardized interface to the SMD at the same time as sealing the enclosed one ore more devices.

In another implementation, an entire circuit is combined to a system-in-a-package (SiP) comprising the desired number of devices hermetically sealed and soldered to a wafer. In this implementation, the end user provides a detailed specification including at least the number and types of discrete and/or passive devices to be included in each package, specific application for each packages, types of hermetic seals needed, and package size requirements. Then, a complete circuit SiP integration can be provided to the end user. These two implementations provide flexibility to the end-user to meet the user's packaging needs depending on the desired application and specification.

An alternative implementation uses the top side (e.g., 101, 301) of the silicon structure (e.g., 100, 300) for surface mounting the structure to a board or other suitable substrate while components are placed on the bottom surface (e.g., 120, 320). In this implementation only a small cavity is used to define the micro-vias (e.g., 124, 324). This provides room for the SMT land pads (e.g., 122, 322) on the bottom surface and allows the sloped edges (e.g., 110, 310) to be defined for solder filleting during surface mounting of the silicon structure to a board or other similar substrate. The layout of the contact pads (e.g., 106, 304) can follow the QFN/SON design rules. In some implementations, light emitting device (LED) applications can benefit from using a reflective metal on the slanted side walls (e.g., 303) of the cavity (e.g., 302) and the low thermal resistance of the silicon structure (e.g., 300).

The leadless QFN/SON type silicon package is applicable in various applications and industries including medical devices and cell phones. In one implementation, the leadless hermetically sealed package may enclose a DC switch. For example, a magnetic MEMS switch can toggle between an "on" state and an "off" state based on an applied magnetic field. For handheld device application, frequency operated switches may be used in the antenna interface to receive/send signals.

Figure 4:
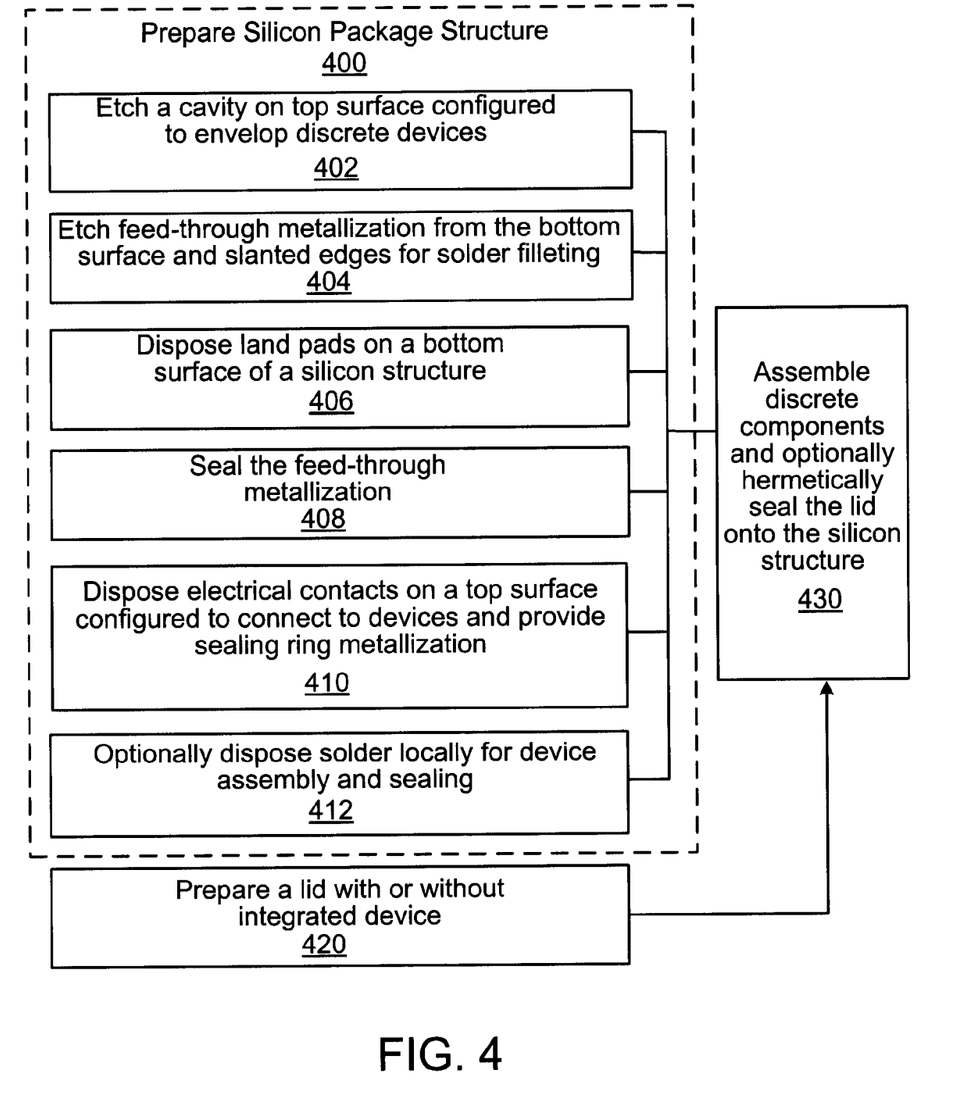
FIG. 4 is a block diagram describing a method of manufacturing a small leadless package.

FIG. 4 is a flow chart describing a method of manufacturing a small leadless package for housing an integrated circuit chip and a micro-electromechanical system (MEMS) device. The method can be implemented to create a QFN or a SON type package. In contrast to a plastic QFN/SON package, a silicon structure can be used to achieve a hermetically sealed package. A hermetic seal provides a state or condition of being air or gas tight. Certain devices such as MEMS devices require a dedicated atmospheric or vacuum environment to operate properly, and the hermetic seal provides the necessary environment by preventing gas diffusion out of or into the package. Because of the package materials, (including silicon, glass, ceramic, metal, and other suitable materials), hermetically sealed packages are able to withstand temperatures higher than the equivalent plastic packages. Especially, MEMS and electro-optical subcomponents such as lasers, detectors or filter devices are very susceptible to moisture, potentially degrading their device characteristics.

At 400, a package including the silicon structure 100 (FIG. 1A-B), 200 (FIG. 2) or 300 (FIG. 3) may be prepared. The size of the package is scalable in thickness, width and length. The number of contacts (e.g., 122, 322) on the bottom side (e.g., 120, 320) are defined by the used assembly technology and the outer dimensions of the package and can be arranged in QFN or SON contact layout with slanted edges (e.g., 112, 310) for solder filleting. The silicon cap structure (e.g., 100, 200, 300) may be configured in various sizes including dimensions of 2×2 mm, 3×3 mm, and 1×1 mm. The metallization layout in the cavity (e.g., 110, 302) of the top surface (e.g., 101, 301) can be adjusted to the discrete device requirements, and solder might be applied locally on the metallization for solder mounting of discrete devices (e.g., 118) into the cavity (e.g., 110, 302).

At 402, a cavity 110 is created on the top surface 101 of the silicon cap structure 100 for housing discrete devices. The cavity 110 may be created by etching.

At 404, the micro-vias (e.g., 124, 324) can be formed. The micro-vias (e.g., 124, 342) can extend through the silicon cap structure (e.g., 100, 300) from the bottom surface (e.g., 120, 320) into the cavity (e.g., 110, 302) on the top surface (e.g., 101, 301). The micro-vias (e.g., 124, 324) can be etched and may extend several microns in size. The sloped edges (e.g., 112, 310) on the bottom surface (e.g., 120, 320) of the silicon structure (e.g., 100, 300) can be defined by etching. The micro-via formation and the sloped etches can be created during the same process. Wet etching of the silicon may be used to produce slopes at an angle of about 54.7°.

At 406, multiple land pads (e.g., 122, 322) are disposed on a bottom surface (e.g., 120, 320) of the silicon cap structure (e.g., 100, 300). Proper design and deposition of land pads (e.g., 122, 322) facilitate reliable electrical and mechanical connections for a QFN/SON package between the package and a substrate (e.g., motherboard). Specifically, the land pads (e.g., 122, 322) are located near the periphery and extend to two or more edges of the bottom surface (e.g., 120, 320). An electroplating technique can be implemented to deposit metallization on the land pads (e.g., 122, 322) extending along the sloped side edges (e.g., 112, 310). The sloped side edges (e.g., 112, 310) facilitate solder filleting and therefore inspection of the solder wetting after the package has been soldered to a circuit board or other suitable substrate. The land pads (e.g., 122, 322) may comply with QFN/SON design rules.

At 408 the etched micro-vias (e.g., 124, 324) may be filled and sealed with feed-through metallization (e.g., 126, 326) extending through the micro-vias (e.g., 124, 324) from the bottom surface (e.g., 120, 320) of the silicon structure (e.g., 100, 300) to the top surface (e.g., 101, 301). The feed-through metallization (e.g., 126, 326) may be created using an electroplating technique. An example of such a technique is disclosed in U.S. Pat. No. 6,818,464, which is incorporated herein by reference.

At 410, the bottom of the cavity (e.g., 110, 302) may be populated with electrical contacts (e.g., 106, 304) to provide electrical connections to the feed-through metallization (e.g., 126, 326). The electrical contacts (e.g., 106, 304) also provide electrical connections to the discrete devices housed in the cavity (e.g., 110, 302). In one implementation, the electrical contacts (e.g., 106, 304) may include wire bond pads, whereby the device is electrically connected to the wire bond pads using wire bonding. In an alternate implementation, the device may be electrically connected to dedicated contact layouts in the cavity (e.g., 110, 302) using flip-chip bonding. In addition, a ground (GND) metallization plane and thermal pad (e.g., 104, 306) may be disposed in the center of the cavity (e.g., 110, 302) to enhance the thermal performance. The sloped walls (e.g., 303) of the cavity (e.g., 302) can be metallized for shielding or reflectivity.

In some implementations, a metal sealing ring (e.g., 108, 210) can be disposed together with solder contacts for providing an electrical connection to a lid (e.g., 202). The metal sealing ring (e.g., 108, 210) enables hermetic sealing of the silicon structure (e.g., 100, 200). Optionally, metal solder can be deposited on the top surface (e.g., 101, 301) to facilitate hermetic sealing and device assembly at 412.

At 420, a lid (e.g., 202) for attaching to the silicon structure (e.g., 200) and completing the hermetical seal can optionally be prepared. Depending on the application and the discrete and/or passive devices enclosed within the leadless package, the lid (e.g., 202) may include at least one of a silicon lid, a glass lid, or a silicon lid with another device integrated such as a MEMS device. Electrical connections from the silicon structure (e.g., 100, 200, 300) to the lid (e.g., 202) can be provided using metal solder (e.g., as used in some applications for hermetic sealing a package) as well.

In some implementations, a transparent glass lid may be implemented to allow light transmission into or out of the hermetically sealed package. The package allows for integration of drivers or amplifiers together with electro-optical or electro-mechanical devices.

At 430, the leadless package is prepared for final assembly and an optional hermetic seal. Assembly of the small leadless package can be completed, for example, by using conductive adhesives. Conductive adhesives also simultaneously provides an electrical contact to the enclosed discrete and/or passive device. In addition, wire bonds (e.g., 116) can be disposed to connect the device to the electrical pads (e.g., 106) in the cavity (e.g., 110). Flip chip assembly of the small leadless package utilizing metal solder or thermo-compression bonding would form electrical connections directly to the pads 106. The silicon structure (e.g., 100) can be used unsealed or sealed. For example, a hermetic seal can be achieved in one implementation using metal soldering. A metal sealing ring (e.g., 108) is disposed on the top surface (e.g., 101) near the periphery to facilitate metal soldering of the silicon structure to a lid (e.g., 202). Metal soldering is particularly advantageous for hermetically sealing and simultaneously creating electrical connections from the silicon structure (e.g., 100, 200, 300) to the lid (e.g., 202) to operate an integrated device in the lid (e.g., 202) such as a MEMS device (e.g., 204). The MEMS device (e.g., 204) may be hermetically sealed to the silicon structure (e.g., 100, 200, 300) along with the discrete and/or passive devices (e.g., 212) housed in the cavity 220. In some implementations, other suitable sealing methods such as anodic bonding or glass frit sealing can be implemented.

Several implementations of the disclosure have been described. Nevertheless, it will be understood that various modifications may be made without departing from the scope of the following claims.

What is claimed is:

1. A leadless package for housing discrete devices, the leadless package comprising:
   a silicon structure having a top surface and a bottom surface, the silicon structure including:
   a plurality of SMT land pads disposed on the bottom surface of the silicon structure, the SMT land pads configured to provide electrical connections to a substrate;
   a concave surface on the top surface of the silicon structure, the concave surface defining a cavity configured to envelop one or more discrete devices;
   a plurality of electrical contacts disposed entirely within the cavity on the concave surface of the top surface, the electrical contacts configured to provide electrical connections to the one or more devices enveloped in the cavity;
   a plurality of interconnected walls disposed through the silicon structure, the interconnected walls defining a plurality of micro-vias configured to extend from the SMT land pads on the bottom surface to the electrical contacts on the top surface of the silicon structure;
   feed-through metallization disposed through the micro-vias, the feed-through metallization configured to form electrical connections from the SMT land pads on the bottom surface through the silicon structure to the electrical contacts on the top surface; and
   a plurality of sloped side edges on the bottom surface of the silicon structure, the sloped side edges configured to extend therein electrical connections to the SMT land pads for solder filleting and post soldering inspection, wherein at least one of the SMT land pads extends directly on one of the sloped side edges toward the top surface of the silicon structure.

2. The leadless package of claim 1 further comprising a lid disposed on the top surface of the silicon structure, the lid configured to provide a hermetic seal.

3. The leadless package of claim 2 wherein the lid is further configured to provide the hermetic seal using anodic bonding.

4. The leadless package of claim 3 wherein the lid comprises a transparent lid configured to allow light to pass through the transparent lid.

5. The leadless package of claim 1 wherein the electrical contacts comprise wire bond pads configured to provide electrical connections to the one or more devices using wire bonds.

6. The leadless package of claim 1 wherein the electrical contacts comprise dedicated contact layouts configured to provide electrical connections to the one or more devices using flip-chip bonds.

7. The leadless package of claim 2 wherein the lid is further configured to provide the hermetic seal using metal solder.

8. The leadless package of claim 7 further comprising:
a plurality of solder bumps disposed on the top surface, the solder bumps configured to electrically connect the silicon structure to a second device disposed on the lid.

9. The leadless package of claim 1 wherein the feed-through metallization disposed through the micro-vias further comprises electroplated metallization.

10. The leadless package of claim 1 wherein the sloped side edges further comprises a slope angle of 54.7 degrees.

11. The leadless package of claim 1 wherein the silicon structure is further configured to provide a standard interface from a micro-electromechanical system (MEMS) device to a circuit board.

12. The leadless package of claim 1 wherein the SMT land pads comply with QFN/SON design rules.

13. A leadless package comprising:
a silicon structure having a top surface and a bottom surface, the bottom surface including at least one sloped side edge, the silicon structure including:
a plurality of SMT land pads disposed on the bottom surface and extending directly on the at least one sloped side edge of the silicon structure toward the top surface of the silicon structure, the SMT land pads configured to provide electrical connections to a substrate;
a cavity formed in the top surface of the silicon structure configured to envelop one or more discrete devices;
a plurality of electrical contacts disposed entirely within the cavity, the electrical contacts configured to provide electrical connections to the one or more devices enveloped in the cavity;
a plurality of vias extending from the SMT land pads on the bottom surface to the electrical contacts on the top surface of the silicon structure, the vias filled with a metal to form electrical connections from the SMT land pads on the bottom surface through the silicon structure to the electrical contacts on the top surface; and
a wire connection connecting at least one of the plurality of electrical contacts to the one or more devices enveloped in the cavity.

14. The leadless package of claim 13, wherein a portion of the top surface defines the cavity and the plurality of electrical contacts are disposed on the portion.

15. The leadless package of claim 13, wherein the portion of the top surface defining the cavity includes a substantially flat portion and the plurality of electrical contacts are disposed on the substantially flat portion.

16. The leadless package of claim 13, further comprising a lid disposed on the top surface of the silicon structure, the lid configured to provide a hermetic seal.

17. The leadless package of claim 16, wherein the lid is configured to provide the hermetic seal using anodic bonding.

18. The leadless package of claim 16, wherein the lid is configured to provide the hermetic seal using metal solder.

19. The leadless package of claim 16, wherein the lid comprises a transparent lid configured to allow light to pass through the transparent lid.

20. The leadless package of claim 16, further comprising a plurality of solder bumps disposed on the top surface, the solder bumps configured to electrically connect the silicon structure to a second device disposed on the lid.

21. The leadless package of claim 16, wherein the lid configured to provide a hermetic seal includes a metal soldering ring on the top surface configured to provide the hermetic seal between the lid and the silicon structure.

22. The leadless package of claim 16, further comprising at least one lid interfacing contact formed on a portion of the top surface positioned outside the cavity to provide an electrical contact between the silicon structure and the lid.

23. The leadless package of claim 16, wherein an outer periphery of the leadless package is defined by the lid and the silicon structure.

24. The leadless package of claim 13, wherein the plurality of electrical contacts comprise a plurality of wire bond pads configured to provide electrical connections to the one or more devices using wire bonds.

25. The leadless package of claim 13, wherein the plurality of electrical contacts comprise dedicated contact layouts configured to provide electrical connections to the one or more devices using flip-chip bonds.

26. The leadless package of claim 13, wherein the at least one sloped side edge is configured to extend therein electrical connections to the SMT land pads for solder filleting and post soldering inspection.

27. The leadless package of claim 26 wherein the sloped side edge further comprises a slope angle of 54.7 degrees.

28. The leadless package of claim 13 wherein the silicon structure is further configured to provide a standard interface from a micro-electromechanical system (MEMS) device to a circuit board.

29. The leadless package of claim 13, wherein the wire connection connects to a top surface of at least one of the one or more devices enveloped in the cavity.

* * * * *